(12) United States Patent
Schramm et al.

(10) Patent No.: US 10,660,228 B2
(45) Date of Patent: May 19, 2020

(54) PERIPHERAL STORAGE CARD WITH OFFSET SLOT ALIGNMENT

(71) Applicant: Liqid Inc., Broomfield, CO (US)

(72) Inventors: Bryan Schramm, Broomfield, CO (US); Andrew Rudolph Heyd, Longmont, CO (US); Brenden Michael Rust, Loveland, CO (US); Christopher R. Long, Colorado Springs, CO (US); Sumit Puri, Calabasas, CA (US)

(73) Assignee: Liqid Inc., Broomfield, CO (US)

( * ) Notice: Subject to any disclaimer, the term of this patent is extended or adjusted under 35 U.S.C. 154(b) by 0 days.

(21) Appl. No.: 16/054,212

(22) Filed: Aug. 3, 2018

(65) Prior Publication Data

US 2020/0045843 A1 Feb. 6, 2020

(51) Int. Cl.
*H05K 7/10* (2006.01)
*H05K 7/14* (2006.01)
*G06F 1/18* (2006.01)

(52) U.S. Cl.
CPC .......... *H05K 7/142* (2013.01); *G06F 1/185* (2013.01); *G06F 1/186* (2013.01); *G06F 2213/0026* (2013.01)

(58) Field of Classification Search
CPC .................. H05K 3/3452; H05K 1/144; H01L 2924/3011; H01L 2224/48091
See application file for complete search history.

(56) References Cited

U.S. PATENT DOCUMENTS

| 5,828,207 A | 10/1998 | Saadeh |
| 5,839,907 A | 11/1998 | Kuo |
| 6,061,750 A | 5/2000 | Beardsley et al. |
| 6,146,150 A * | 11/2000 | Roberts .................. G06F 1/184 439/55 |
| 6,325,636 B1 | 12/2001 | Hipp et al. |

(Continued)

FOREIGN PATENT DOCUMENTS

CN 206178569 U 5/2017

OTHER PUBLICATIONS

Aragon, Juan L. et al., "Control Speculation for Energy-Efficient Next-Generation Superscalar Processors," IEEE Transactions on Computers, vol. 55, No. 3, pp. 281-291, Mar. 2006.

(Continued)

*Primary Examiner* — Pete T Lee

(57) ABSTRACT

A storage card insertable into a host system is provided that includes a plurality of storage devices connectors. The storage card include slot offset features to offset a circuit board of the storage card from a host system slot alignment. This offset provides for storage device connector placement on both sides of the storage card. The storage card also can include a Peripheral Component Interconnect Express (PCIe) switch circuit configured to communicatively couple the PCIe signaling of the plurality of storage device connectors and PCIe signaling of a host connector of the storage card, where the PCIe switch circuit is configured to receive storage operations over the PCIe signaling of the host connector of the storage card and transfer the storage operations for delivery over the PCIe signaling of selected ones of the plurality of storage device connectors.

20 Claims, 8 Drawing Sheets

(56) References Cited

U.S. PATENT DOCUMENTS

| | | | |
|---|---|---|---|
| 6,647,451 B1* | 11/2003 | Barmore | G06F 9/4411 710/301 |
| 6,978,333 B2* | 12/2005 | Timmins | G06F 13/4086 326/30 |
| 7,243,145 B1 | 7/2007 | Poortman | |
| 7,260,487 B2 | 8/2007 | Brey et al. | |
| 7,505,889 B2 | 3/2009 | Salmonsen et al. | |
| 7,606,960 B2 | 10/2009 | Munguia | |
| 7,725,757 B2 | 5/2010 | Padweka et al. | |
| 7,877,542 B2 | 1/2011 | Chow et al. | |
| 8,125,919 B1 | 2/2012 | Khanka et al. | |
| 8,150,800 B2 | 4/2012 | Webman et al. | |
| 8,656,117 B1 | 2/2014 | Wong et al. | |
| 8,688,926 B2 | 4/2014 | Breakstone et al. | |
| 8,706,932 B1* | 4/2014 | Kanapathippillai | G06F 13/1694 710/62 |
| 8,880,771 B2 | 11/2014 | Subramaniyan et al. | |
| 9,552,316 B2 | 1/2017 | Desimone et al. | |
| 9,602,437 B1 | 3/2017 | Bernath | |
| 9,996,495 B2 | 6/2018 | Feldman et al. | |
| 2002/0034068 A1 | 3/2002 | Weber et al. | |
| 2002/0059428 A1 | 5/2002 | Susai et al. | |
| 2002/0080541 A1* | 6/2002 | Bunker | G06F 1/184 361/72 |
| 2003/0110423 A1 | 6/2003 | Helms et al. | |
| 2003/0126478 A1 | 7/2003 | Burns et al. | |
| 2005/0223136 A1 | 10/2005 | Tanaka et al. | |
| 2006/0238991 A1* | 10/2006 | Drako | G06F 1/185 361/796 |
| 2006/0242345 A1 | 10/2006 | Berl | |
| 2006/0277206 A1 | 12/2006 | Bailey et al. | |
| 2007/0067432 A1 | 3/2007 | Tarui et al. | |
| 2008/0034153 A1 | 2/2008 | Lee et al. | |
| 2008/0198744 A1 | 8/2008 | Menth | |
| 2008/0281938 A1 | 11/2008 | Rai et al. | |
| 2009/0006837 A1 | 1/2009 | Rothman et al. | |
| 2009/0100280 A1 | 4/2009 | Lindsay | |
| 2009/0190427 A1 | 7/2009 | Brittain et al. | |
| 2009/0193201 A1 | 7/2009 | Brittain et al. | |
| 2009/0193203 A1 | 7/2009 | Brittain et al. | |
| 2009/0276551 A1 | 11/2009 | Brown et al. | |
| 2010/0088467 A1 | 4/2010 | Lee et al. | |
| 2011/0289510 A1 | 11/2011 | Lin et al. | |
| 2011/0299317 A1 | 12/2011 | Shaeffer et al. | |
| 2011/0320861 A1 | 12/2011 | Bayer et al. | |
| 2012/0030544 A1 | 2/2012 | Fisher-Jeffes | |
| 2012/0089854 A1 | 4/2012 | Breakstone et al. | |
| 2012/0151118 A1 | 6/2012 | Flynn et al. | |
| 2012/0166699 A1 | 6/2012 | Kumar et al. | |
| 2012/0210163 A1 | 8/2012 | Cho | |
| 2012/0317433 A1 | 12/2012 | Ellis et al. | |
| 2013/0042041 A1 | 2/2013 | Sun | |
| 2013/0132643 A1 | 5/2013 | Huang | |
| 2013/0185416 A1 | 7/2013 | Larkin et al. | |
| 2014/0047166 A1 | 2/2014 | Asnaashari et al. | |
| 2014/0056319 A1 | 2/2014 | Hellwig | |
| 2014/0059265 A1 | 2/2014 | Iyer et al. | |
| 2014/0075235 A1 | 3/2014 | Chandhoke et al. | |
| 2014/0103955 A1 | 4/2014 | Avritch et al. | |
| 2014/0108846 A1 | 4/2014 | Berke et al. | |
| 2014/0353264 A1 | 12/2014 | Venugopal et al. | |
| 2014/0365714 A1 | 12/2014 | Sweere et al. | |
| 2015/0074322 A1 | 3/2015 | Galles | |
| 2015/0121115 A1 | 4/2015 | Chandra et al. | |
| 2015/0186437 A1 | 7/2015 | Molaro | |
| 2015/0212755 A1 | 7/2015 | Asnaashari | |
| 2015/0304423 A1 | 10/2015 | Satoyama et al. | |
| 2015/0370665 A1* | 12/2015 | Cannata | G06F 3/0685 714/4.11 |
| 2015/0373115 A1 | 12/2015 | Breakstone et al. | |
| 2016/0197996 A1 | 7/2016 | Barton et al. | |
| 2016/0248631 A1 | 8/2016 | Duchesneau | |
| 2016/0299863 A1 | 10/2016 | Feldman et al. | |
| 2016/0335220 A1 | 11/2016 | Breakstone et al. | |
| 2017/0017600 A1 | 1/2017 | Breakstone et al. | |
| 2017/0220505 A1 | 8/2017 | Breakstone et al. | |
| 2018/0113822 A1* | 4/2018 | Pronozuk | G06F 13/1694 |

OTHER PUBLICATIONS

International Application No. PCT/US2017/046602, International Search Report & Written Opinion, 8 pages, dated Oct. 19, 2017.

International Application No. PCT/US2017/046607, International Search Report & Written Opinion, 7 pages, dated Oct. 23, 2017.

Lu, Yingping et al., "Performance Study of iSCSI-Based Storage Subsystems," IEEE Communications Magazine, pp. 76-82, Aug. 2003.

International Application No. PCT/US2018/066177, International Search Report & Written Opinion, 14 pages, dated Mar. 6, 2019.

Taiwan Patent Application No. 107146879, Office Action, 29 pages, dated Oct. 3, 2019.

* cited by examiner

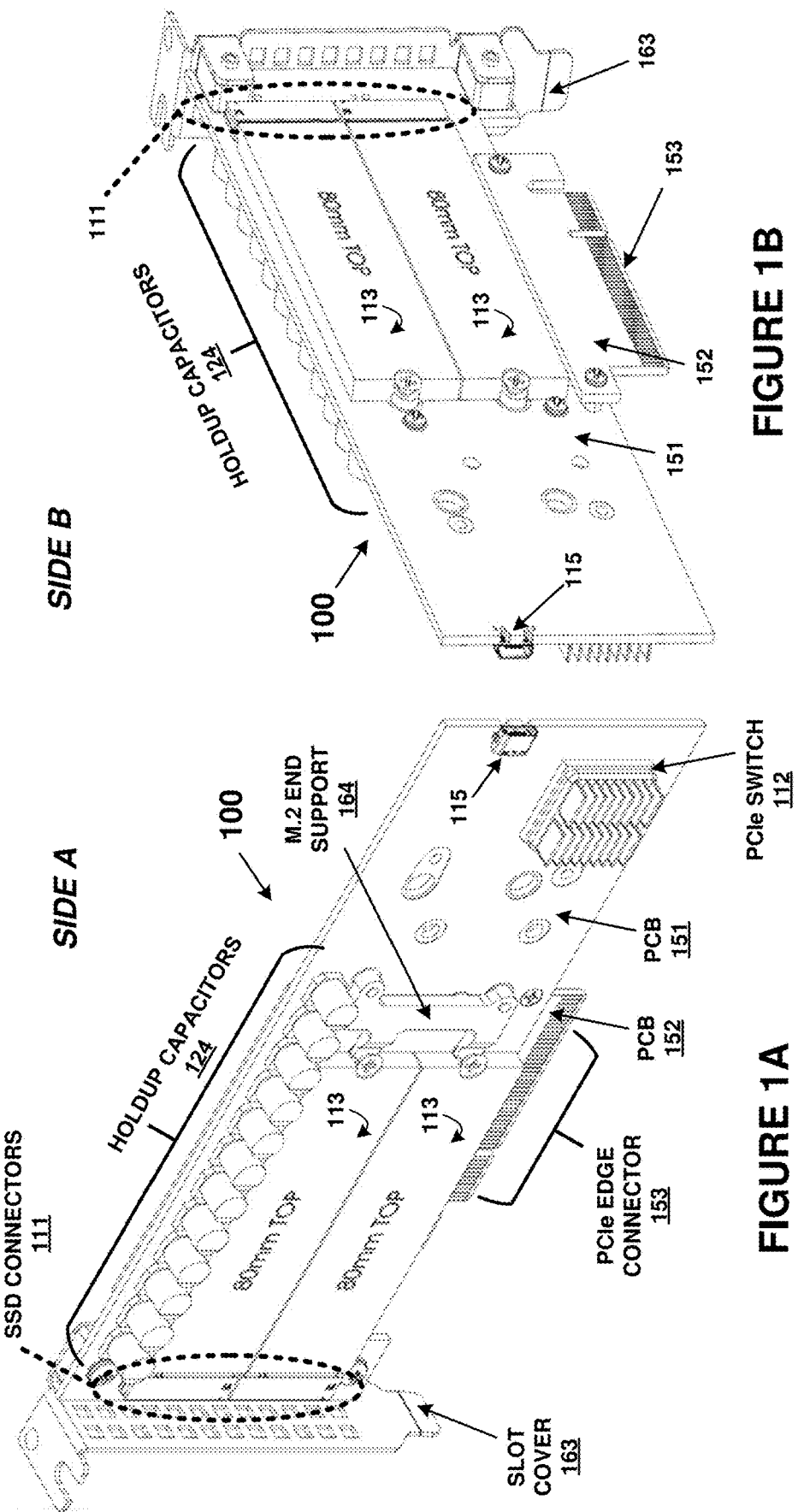

PERIPHERAL STORAGE CARD WITH OFFSET SLOT ALIGNMENT

BACKGROUND

Computer systems typically include bulk storage systems, such as magnetic disk drives, optical storage devices, tape drives, or solid-state storage drives, among other storage systems. As storage needs have increased in these computer systems, networked storage systems have been introduced which store large amounts of data in a storage environment physically separate from end user computer devices. These networked storage systems typically provide access to bulk data storage over one or more network interfaces to end users or other external systems. In addition to storage of data, remote computing systems include various processing systems that can provide remote computing resources to end users. These networked storage systems and remote computing systems can be included in high-density installations, such as rack-mounted environments.

However, as the densities of networked storage systems and remote computing systems increase, various physical limitations can be reached. These limitations include density limitations based on the underlying storage technology, such as in the example of large arrays of rotating magnetic media storage systems. These limitations can also include computing density limitations based on the various physical space requirements for network interconnect as well as the large space requirements for environmental climate control systems.

In addition to physical space limitations, these bulk storage systems have been traditionally limited in the number of devices that can be included per host, which can be problematic in storage environments where higher capacity, redundancy, and reliability is desired. These shortcomings can be especially pronounced with the increasing data storage and retrieval needs in networked, cloud, and enterprise environments.

OVERVIEW

Various computer peripheral cards, devices, systems, methods, and software are provided herein. In one example, a storage card insertable into a host system includes a plurality of storage devices connectors. The storage card include slot offset features to offset a circuit board of the storage card from a host system slot alignment. This offset provides for storage device connector placement on both sides of the storage card. The storage card also includes a Peripheral Component Interconnect Express (PCIe) switch circuit configured to communicatively couple the PCIe signaling of the plurality of storage device connectors and PCIe signaling of a host connector of the storage card, where the PCIe switch circuit is configured to receive storage operations over the PCIe signaling of the host connector of the storage card and transfer the storage operations for delivery over the PCIe signaling of selected ones of the plurality of storage device connectors.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

FIG. 1A illustrates an example physical configuration of a storage card.

FIG. 1B illustrates an example schematic configuration of a storage card.

DETAILED DESCRIPTION

Figure 2B:
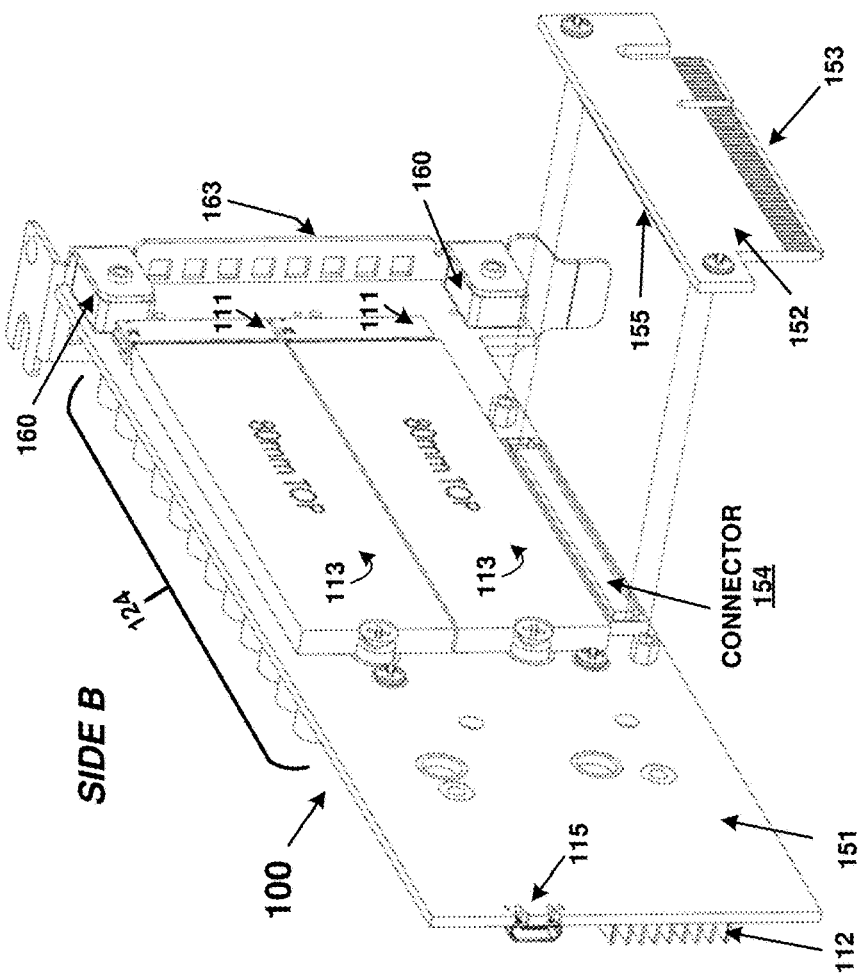
FIG. 2B illustrates an example schematic configuration of a storage card.

In the examples herein, various storage cards are shown that have one or more storage drives to provide data storage capabilities for a host system. A storage card can be insertable into a slot or mating connector of a host system. A storage card might comprise a peripheral add-in card. Typically, host systems can have one or more slots available for plugging in of various add-in cards which couple to the host system via one or more edge connectors. The add-in cards discussed herein can be insertable into a mating socket of the associated host system, such as a motherboard or daughterboard of a computer or server system. A slot cover might be included with the add-in card, such as seen herein. Various electronics, processing elements, storage elements, or other elements might be included in an add-in card to supplement the capabilities of the host system. In some cases, add-in cards might be added into a chassis or rack-mounted system external from the host system or systems.

In many add-in cards, the printed circuit board (PCB) includes an integral edge connector formed from a portion of the PCB and metallic traces. The positioning of the slot connector with regard to the slot opening can lead to a larger stackup height possible for components mounted on a first side of the PCB versus a second side of the PCB. Although this configuration is sufficient for many add-in cards, such as fixed or soldered-on components it can be difficult to include large amounts of modular storage drives that mate to the PCB via associated connectors. The examples herein provide for enhanced PCB configurations which provide an offset from the slot connector within the slot dimensions to allow for modular storage devices on both sides of the PCB. Advantageously, an increase in storage density and component quantity can be achieved.

FIGS. 1A and 1B are presented to illustrate example physical configurations of storage cards. FIG. 1A illustrates side 'A' of an example physical configuration of storage card 100. FIG. 1B illustrates side 'B' of an example physical configuration of storage card 100. Storage card 100 is formed from at least two printed circuit boards in this example. Primary circuit board (also referred to herein as a printed circuit board) 151 includes many of the components of storage card 100. Secondary circuitry board (PCB) 152 includes edge connector 153 and one or more further connectors for coupling to primary circuit board 151. Slot cover 163 is optionally included to cover a slot opening in a host system.

Storage card 100 includes one or more storage drive connectors 111 which can couple to one or more storage drives 113, PCIe switch 112, auxiliary interface 115, and holdup capacitors 124. Although now shown in FIGS. 1A and 1B for clarity, a power control module is included that distributes power to each element of storage card 100 over associated power links. Power control module, such as power control 521 of FIG. 5, can selectively enable/disable power for each power link and provide holdup power to on-board components using at least holdup capacitors 124. Further communication links can be included for intra-card communication between the various elements of storage card 100.

Storage card 100 includes one or more storage drives 113, such as two on each PCB side shown in FIGS. 1A and 1B. Storage drives 113 are arranged on both sides of storage card 100. As will be discussed in further examples below, solid state drive (SSD) connectors 111 can comprise M.2 connectors, and each storage drive 113 can comprise M.2 compatible SSDs. Other SSD types and connectors might instead be employed, such as Enterprise & Datacenter Storage Form Factor (EDSFF) storage devices that use the SFF-TA-1002 x4 or x8 connectors, among others. The connectors couple to the same primary printed circuit board (PCB) 151 in this example, albeit with some connectors disposed on a front side (side A) and some connectors disposed on a back side (side B).

Storage card 100 might comprise a HHHL (half-height half-length) PCIe peripheral card. Other card sizes can be employed, such as a FHHL (full-height half-length) or FHFL (full-height full-length), or HHFL (half-height full length), among others. Storage card 100 comprises a compact two-sided arrangement which can fit into a single-width PCIe slot, and onto a HHHL sized PCIe card. In this example, the M.2 SSDs comprise either 110 millimeter (mm) or 80 mm length M.2 SSDs. Other sizes of M.2 SSDs can be included, such as lengths of 16, 26, 30, 38, 42, 60, 80 and 110 mm and widths of 12, 16, 22 and 30 mm M.2 end supports can be included to structurally supports an end of each M.2 SSD which is opposite of the connector end.

Figure 2A:
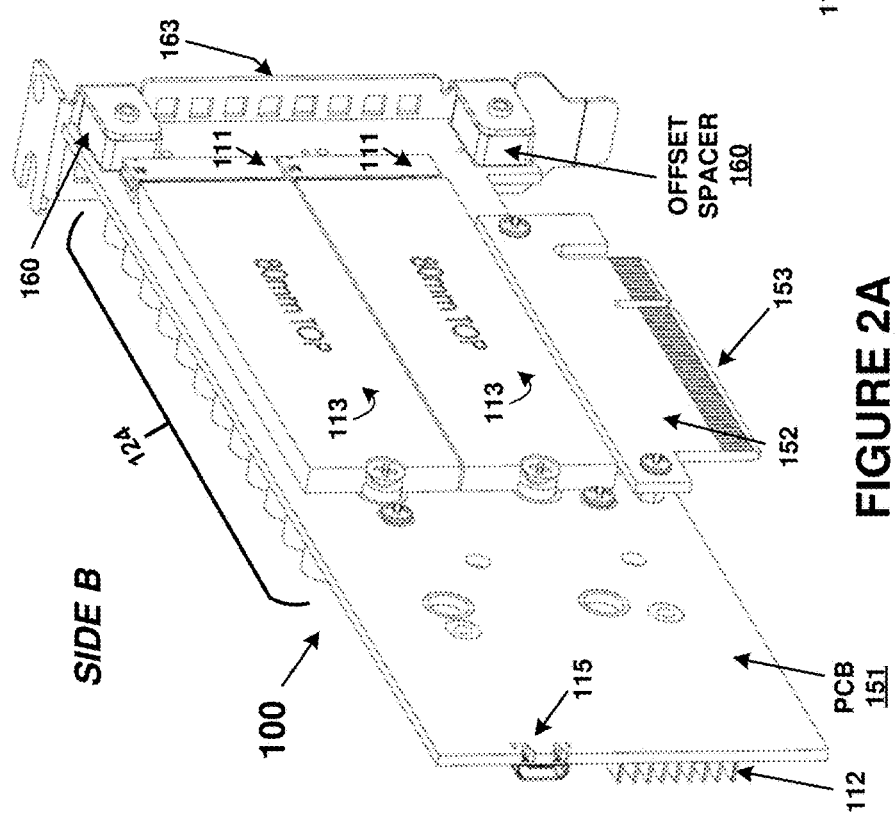
FIG. 2A illustrates an example physical configuration of a storage card.

FIGS. 2A and 2B are presented to illustrate another example physical configuration of storage cards. Specifically, FIGS. 2A and 2B both illustrate side 'B' of an example physical configuration of storage card 100. In this configuration, a rigid secondary PCB is employed as secondary circuitry board 152. Secondary circuitry board 152 communicatively couples to primary circuit board 151 via one or more connectors, which can be referred to herein as mezzanine connectors. Likewise, secondary circuitry board 152 can be referred to herein as a mezzanine board. Connector 155 is included on secondary circuitry board 152, while connector 154 is included on primary circuit board 151. Connectors 154-155 carry signaling and power to and from primary circuit board 151 from secondary circuit board 152. Secondary circuit board 152 includes edge connector 153 which couples into a mating connector in a host system or other peripheral card slot.

Secondary circuitry board 152, when coupled to primary circuit board 151, provides for an offset for primary circuit board 151 away from edge connector 153. The offset distance can vary, and might be established by a stackup height of connectors 154-155. This offset provides for additional clearance on the 'back' side B of storage ecard 100 to mount one or more storage drives 113 via connectors 111. Although slot cover 163 is optional, additional offset spacers 160 can be included to couple slot cover 163 to primary circuit board 151. These offset spacers 160 can ensure that slot cover 163 fits into mating slot cover mounting features of a host system. Offset spacers 160 have a thickness corresponding to an offset provided by secondary circuitry board 152 and connectors 154-155.

Figure 3:
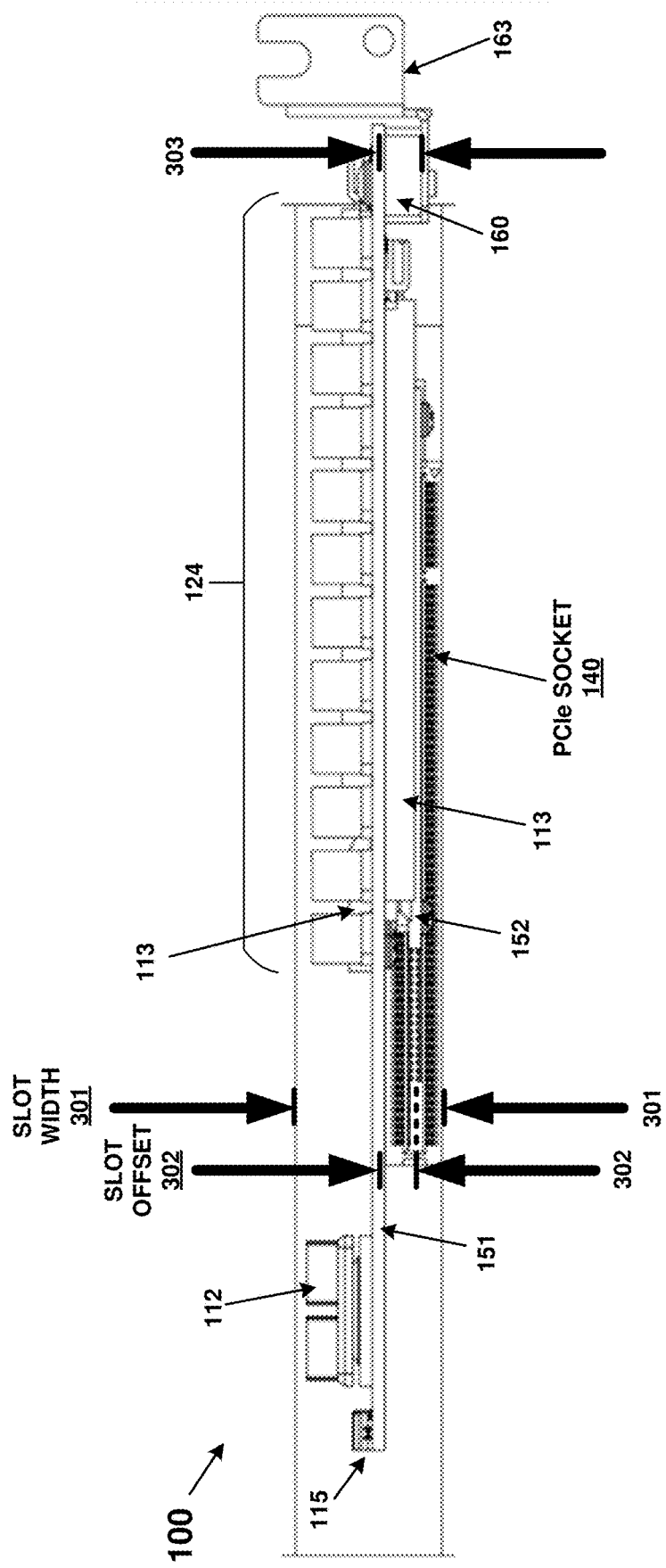
FIG. 3 illustrates an example physical configuration of a storage card.

FIG. 3 illustrates a top view of storage card 100. This top view highlights the offset between primary circuit card 151 and secondary circuit card 152. In FIG. 3, a slot width 301 is provided which encompasses a total width of a host slot into which storage card 100 can fit. Storage card 100 typically occupies less than the width indicated by slot width 301, although multi-slot width cards can be provided in other examples.

However, instead of having primary circuit card 151 aligned with PCIe socket 140, secondary circuit card 152 is aligned with PCIe socket 140. Slot offset 302 is provided between primary circuit card 151 and secondary circuit card 152 which offsets primary circuit card 151 from socket 140. Edge connector 153 on secondary circuit card 152 is aligned with socket 140 for insertion of storage card 100 into socket 140 and the corresponding host slot. As can be seen in FIG. 3, storage drives 113 can be mounted onto either side of primary circuit board 151 due in part to the offset created by secondary circuit board 152 from socket 140. When a slot cover is employed, offset spacers 160 can be employed to establish offset 303 between the slot cover and primary circuit board 151.

Figure 4:
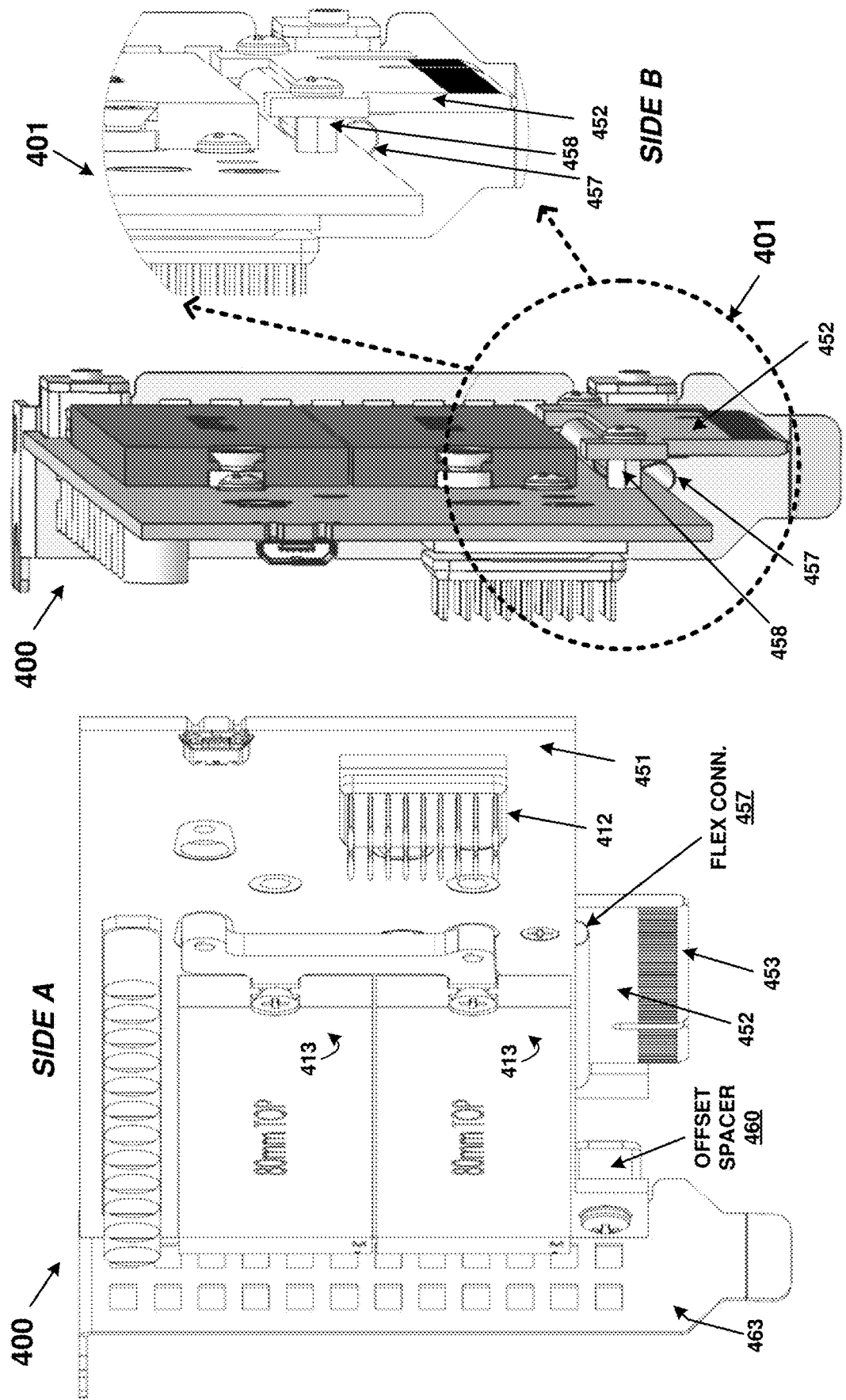
FIG. 4 illustrates an example physical configuration of a storage card.

FIG. 4 is presented to illustrate an alternative arrangement of the secondary circuit board. FIG. 4 illustrates storage card 400 which includes storage drives 413 on both sides of primary circuit board 451. Optional slot cover 463 can be included, as well as offset spacers 460 for slot cover 463. PCIe switch circuitry 412 can also be included to electrically couple interfaces of storage drives 413 to host signaling associated with edge connector 453.

In this configuration, secondary circuit board 452 includes edge connector 453 as well as flexible connector 457. Flexible connector 457 as well as one or more standoffs 458 provide for an offset between edge connector 453 and primary circuit board 451. Additional connectors may be included on one or more among primary circuit board 451 and secondary circuit board 452 to couple with flex connector 457. However, direct soldered connections might instead be employed to couple with flex connector 457. A detailed view 401 is included in FIG. 4 to further illustrate flexible circuit connection 457 between primary circuit board 451 and secondary circuit board 452. Flexible circuit connection 457 carries PCIe signaling, sideband signaling, power connections, among other electrical signaling between primary circuit board 451 and secondary circuit board 452. Flexible circuit connection 457 might comprise one or more sections of flexible circuitry, among various rigid portions. Rigid-flex circuit elements can be employed with both flexible and rigid portions.

Figure 5A:
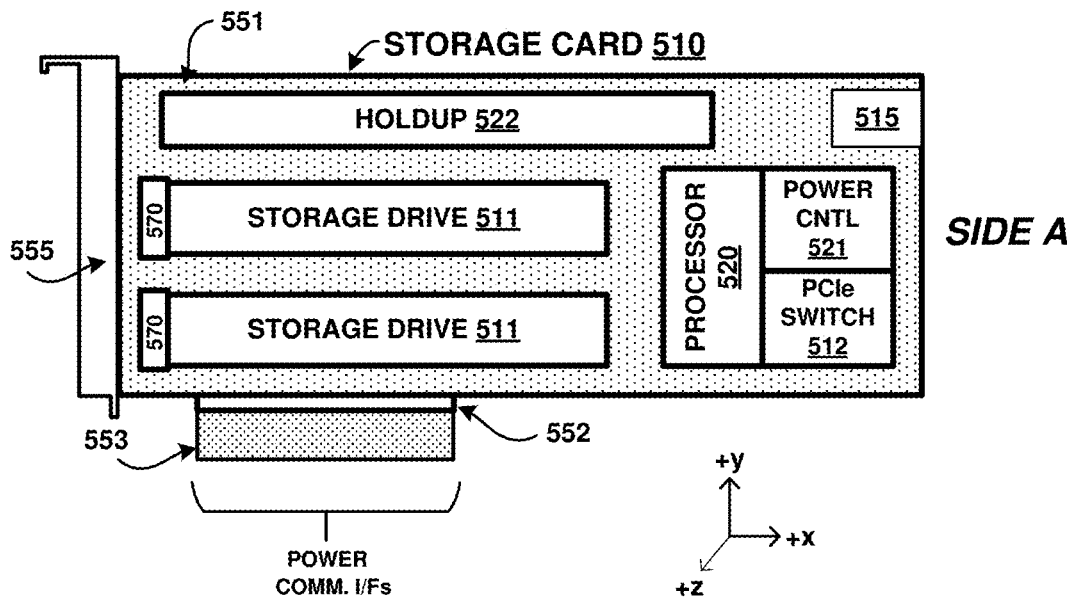
FIG. 5A is a block diagram illustrating a storage card.
Figure 5B:
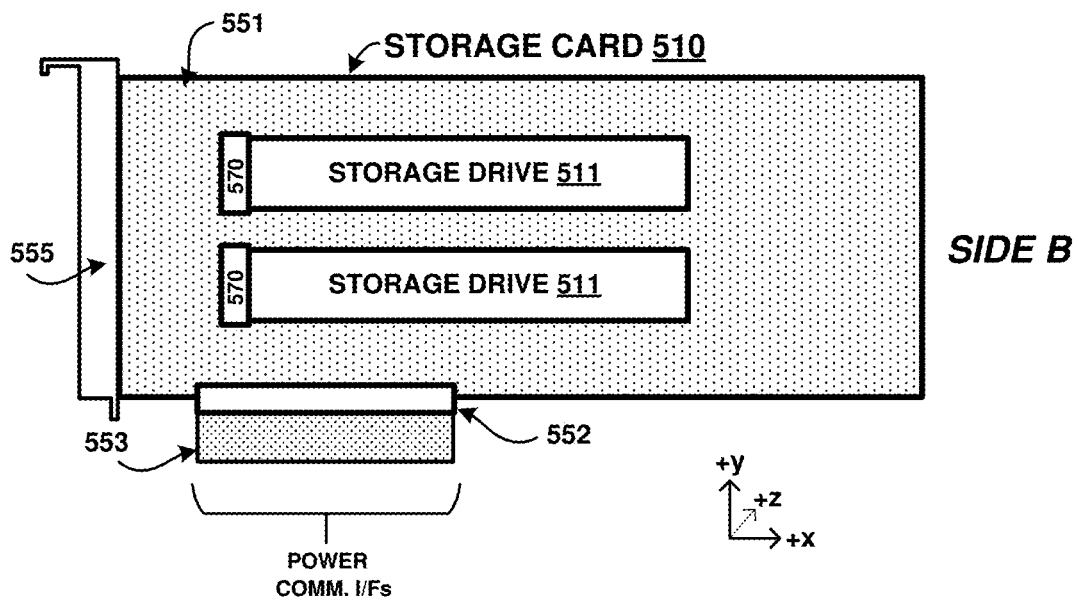
FIG. 5B is a block diagram illustrating a storage card.
Figure 6:
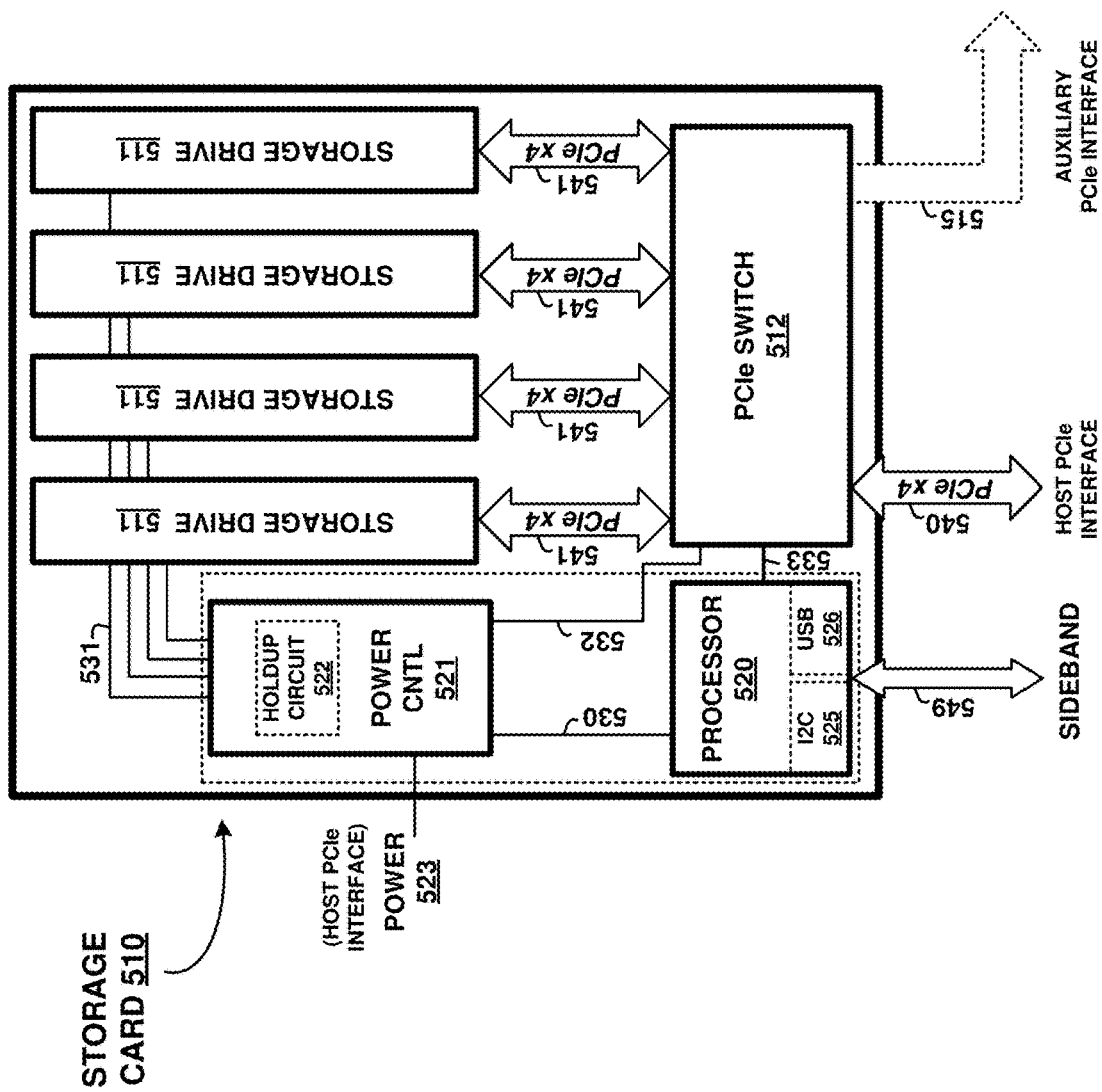
FIG. 6 is a block diagram illustrating a storage card.

FIG. 5A illustrates an example schematic representation of a first side 'A' of storage card 510. FIG. 5B illustrates an example schematic representation of a second side 'B' of storage card 510. FIG. 6 illustrates an example schematic configuration of storage card 510. Storage card 510 includes four storage drives 511, PCIe switch 512, processor 520, power control module 521, and holdup circuit 522. Power control module 521 distributes power to each element of storage card 510 over associated power links 530-532. Power control module 521 can selectively enable/disable power for each power link. Further communication links can be included for intra-card communication between the various elements of storage card 510.

Components 511, 512, 515, 520, 521, 522, and 570 are mounted on circuit board 551 in this example. Additionally, circuit board 551 includes one or more connectors for coupling to circuit board 553. For example, mezzanine connector 552 can be employed to physically and communicatively couple circuit board 551 to circuit board 553. As discussed in the preceding Figures, an offset is provided between circuit board 551 to circuit board 553. This offset provides for mounting of storage drives 511 on both sides of storage card 510 while still allowing for storage card 510 to fit into a single slot of a host system. Optional slot cover 555 can be included along with associated offset elements to cover a slot opening associated with the slot into which storage card 510 is inserted.

Storage card 510 includes one or more storage drives 511, such as four shown in FIGS. 5A, 5B, and 6. Two storage drives 511 are arranged on a front side 'A' of storage card 510, while two storage drives 511 are arranged on a back side 'B' of storage card 510. A first set of connectors is employed for the side A rank of storage drives, while a second set of connectors is employed for the side B rank of storage drives. In FIG. 5A, a +z axis comprises an axis oriented out of the drawing, and an offset is provided by mezzanine connector 552 between circuit board 551 and circuit board 553 along the z-axis. One or more storage drives can be included in each rank, with associated connectors 570 that couple to the storage drives. As will be discussed in further examples below, connectors 570 can comprise M.2 connectors, and each storage drive 511 can comprise M.2 solid state drives (SSD). The connectors couple to the same printed circuit board (PCB) 551 in this example.

Storage card 510 also includes one or more Peripheral Component Interconnect Express (PCIe) switches, processors, and control system elements. PCIe switch 512 communicates with one or more on-card storage drives over associated PCIe links. PCIe switch 512 is also communicatively coupled to an on-card processor or control system for traffic statistics retrieval, power monitoring, status monitoring, among other operations.

PCIe switch 512 communicates with a host system or host module (not pictured) over PCIe link 540. PCIe link 540 can comprise a PCIe link with multiple lanes, such as a "x4" PCIe link, although a different number of PCIe lanes can be employed. Additionally, more than one PCIe link 540 can be employed for load balancing, redundancy, and failover protection for storage card 510. PCIe switch 512 also communicates with four storage drives 511 over associated x4 PCIe links 541, although a different number of storage drives can be employed. PCIe can support multiple bus widths, such as x1, x4, x8, x16, and x32, with each multiple of bus width comprising an additional "lane" for data transfer. The PCIe links discussed herein can be any generation of PCIe links, such as generations 3, 4, 5, or Gen-Z generations, among others. Storage card 510 also supports transfer of sideband signaling 549, such as System Management Bus (SMBus) interfaces and Joint Test Action Group (JTAG) interfaces, as well as associated clocks, power, and bootstrapping, among other signaling.

PCIe interface 540 can carry NVMe (NVM Express) traffic issued by a host processor or host system. NVMe (NVM Express) is an interface standard for mass storage devices, such as hard disk drives and solid-state memory devices. NVMe can supplant serial ATA (SATA) interfaces for interfacing with mass storage devices in personal computers and server environments. However, these NVMe interfaces are limited to one-to-one host-drive relationship, similar to SATA devices. In the examples discussed herein, a PCIe interface is employed to transport NVMe traffic and present a multi-drive system as one or more NVMe virtual logical unit numbers (VLUNs) over a PCIe interface.

In NVMe operations, such as an NVMe write operation, data can be received over any of PCIe links 540 or 515 for any storage drive 511. For example, a write operation can be an NVMe write operation received over PCIe link 540 from a device employing an NVMe protocol transported over a PCIe interface. In another example, the write operation can be an NVMe write operation received over PCIe link 540 or 515 from an external device employing an NVMe protocol transported over a PCIe interface. An associated storage drive can receive the NVMe traffic over an associated PCIe interface 541 and respond accordingly, such as with a write confirmation or with read data in the case of an NVMe read operation.

In further examples, processor 520 can handle PCIe traffic for the storage drives and manage the storage drives in a logical manner. For example, data striping can be employed by processor 520 to stripe data for a particular write transaction over any number of storage drives 511, such as over all of the storage drives or a subset of the storage drives. Likewise, data redundancy can be employed to mirror data over any of storage drives 511. In further examples, ones of storage drives 511 are presented as one or more logical drives or logical volumes to a host system, such as one or more NVMe virtual logical units (VLUNs). Processor 520 can manage striping, mirroring, or logical volume establishment and presentation. In a first example, processor 520 receives all PCIe traffic for storage drives 511 over PCIe interface 533 and distributes to appropriate storage drives 511 to achieve striping, mirroring, or logical volumes. In other examples, processor 520 monitors traffic in PCIe switch 512 and instructs PCIe switch 512 to direct PCIe traffic to appropriate storage drives to achieve striping, mirroring, or logical volumes.

As mentioned above, processor 520 can present the storage resources of storage card 510 as a VLUN, such as NVMe VLUNs. Processor 520 can present any number of VLUNs to an external system over a PCIe interface, such as any of PCIe links 540 or 515. These VLUNs can be presented as an NVMe target. An NVMe target can present the storage resources of storage card 510 as a single storage target, such as emulating a single storage drive, over a PCIe interface. In this manner, a plurality of storage drives that comprise any number of storage drives 511 can be presented as a single NVMe target to an external system over a PCIe interface. Processor 520 can receive NVMe storage traffic, such as NVMe frames, and distribute these storage transactions for handling by an assigned storage drive 511. In other examples, processor 520 monitors NVMe storage traffic in PCIe switch 512 and instructs PCIe switch 512 to direct PCIe traffic to appropriate storage drives to achieve VLUNs or NVMe targets.

Auxiliary PCIe interface 515 can optionally be included in storage card 510. Auxiliary PCIe interface 515 can be employed to connect two or more PCIe storage cards to each other for transfer of user data, storage operations, status, control signaling, operational information, or other data between storage cards, such as two of storage card 510. Auxiliary PCIe interface 515 can comprise a different PCIe bus width or lane allocation than host PCIe interface 540. Auxiliary PCIe interface 515 can couple a PCIe interface provided by PCIe switch 512 to a PCIe interface of another storage card which can be included in the same host system as storage card 510 or included in another host system. Additionally, a connector can be employed with interface 515 to connect among the various storage cards using associated cabling. In some examples, mini-SAS connectors and cabling are employed and are configured to carry PCIe signaling of auxiliary PCIe interface 515. Auxiliary PCIe interface 515 can also include non-PCIe signaling, such as sideband interfaces 549 or other interfaces.

Auxiliary PCIe interface 515 can be used for cluster interconnect and can terminate at external connectors, such as mini-Serial Attached SCSI (SAS) connectors which are employed to carry PCIe signaling over mini-SAS cabling. In further examples, MiniSAS HD cables are employed that drive 12 Gb/s versus 6 Gb/s of standard SAS cables. 12 Gb/s can support PCIe Gen 3. Connector associated with interface 515 can comprise mini-SAS connectors that comprise mini-SAS jacks. Associated cabling can comprise SAS cabling which can include associated shielding, wiring, sheathing, and termination connectors.

PCIe switch 512 comprises one or more PCIe crosspoint switches, which logically interconnect various ones of the associated PCIe links based at least on the traffic carried by each PCIe link. PCIe switch 512 establishes switched connections between any PCIe interfaces handled by PCIe switch 512. Each PCIe switch port might comprise a non-transparent (NT) or transparent port, as well as ports isolated by domain-based logical port segregation. An NT port can allow some logical isolation between endpoints, while a transparent port does not allow logical isolation, and has the effect of connecting endpoints in a purely switched configuration. Access over an NT port or ports can include additional handshaking between the PCIe switch and the initiating endpoint to select a particular NT port or to allow visibility through the NT port. In other examples, a domain-based PCIe signaling distribution can be included which allows segregation of PCIe ports of a PCIe switch according to user-defined groups. In some examples, PCIe switch 512 comprises one or more among PLX/Broadcom/Avago PEX8796 24-port, 96 lane PCIe switch chips, PEX8725 10-port, 24 lane PCIe switch chips, PEX97xx chips, PEX9797 chips, or other PEX87xx/PEX97xx chips.

Although PCIe link 540 is used in FIGS. 5A and 5B, it should be understood that additional or different communication links or busses can be employed, such as Ethernet, Serial Attached SCSI (SAS), FibreChannel, Thunderbolt, Serial Attached ATA Express (SATA Express), among other interconnect, network, and link interfaces. Any of the links in FIGS. 5A and 5B can each use various communication media, such as air, space, metal, optical fiber, or some other signal propagation path, including combinations thereof. Any of the PCIe links in FIGS. 5A and 5B can include any number of PCIe links or lane configurations. Any of the links in FIGS. 5A and 5B can each be a direct link or might include various equipment, intermediate components, systems, and networks. Any of the links in FIGS. 5A and 5B can each be a common link, shared link, aggregated link, or may be comprised of discrete, separate links.

Processor 520 can optionally communicate over at least sideband links 549. Sideband links 549 can include Universal Serial Bus (USB), SMBus, JTAG, Inter-Integrated Circuit (I2C), controller area network bus (CAN), or any other communication interface, and in some examples is provided over portions of PCIe link 540. In this example, processor 520 includes I2C interface 525 and USB interface 526 for communication over sideband links 549. I2C interface 525 and USB interface 526 can be included in separate circuitry or included in similar elements as processor 520. Processor 520 and PCIe switch 512 can communicate over an associated communication link 533, which can be an I2C or a PCIe link, among other link types.

Each storage drive 511 comprises a solid-state drive (SSD) in this example, and communicates with external systems over an associated PCIe interface included in each storage drive 511. Each storage drive 511 comprises an individual M.2 SSD card, which communicates over an associated PCIe interface 541, which can comprise PCIe interfaces such as described for PCIe interface 540, although variations are possible. The solid-state storage media of storage drives 511 can comprise flash memory, static RAM, NAND flash memory, NOR flash memory, memristors, magnetic random-access memory (MRAM), or other solid-state media. Instead of or in addition to solid state media, each storage drive 511 can comprise magnetic storage, such as hard disk drives, tape drives, magnetoresistive memory devices, and the like, or can comprise optical storage, such as phase change memory.

Each storage drive 511 can receive read transactions and write transactions issued by a host system, such as a host processor. Responsive to a read transaction, each storage drive 511 can retrieve data identified by the read transaction and transfer the data for delivery to the associated host. Responsive to a write transaction, each storage drive 511 can write data that accompanies the write transaction to storage media associated with storage drive 511. Data striping can be employed by storage card 510 to stripe data for a particular write transaction over any number of storage drives 511.

Each storage drive 511 comprises an M.2 circuit card which is separate from circuit board 551 and circuit board 553 and includes a mini-PCI Express connector or other connector that interfaces with a connector on circuit board 551. Circuit board 551 and circuit board 553 each comprise one or more printed circuit boards that couple to the various elements of storage card 510. In other examples, each storage drive 511 comprises one or more flash memory chips with a PCIe interface which is soldered onto circuit board 551. In yet other examples, each storage drive 511 comprises one or more separate solid-state disk drives or magnetic hard disk drives along with associated enclosures and circuitry. In the examples shown in FIGS. 5A and 5B, storage card 510 is shown as an HHHL card (half-height half-length PCIe card). Although card 510 can instead be a FHHL card (full-height half-length PCIe card), FHFL card (full-height full-length PCIe card), or HHFL (half-height full length) in other examples.

Processor 520 comprises one or more microprocessors, processing devices, multi-core processors, processing circuitry, or other processing system. Processor 520 can include one or more non-transitory memory devices, such as RAM, solid state storage, or other memory to store instructions that are executable by processor 520 to operate as discussed herein. In some examples, processor 520 comprises an ARM microcontroller, ARM microprocessor, field-programmable gate array (FPGA), application specific integrated circuit (ASIC), application specific processor, or other microprocessor or processing elements. Processor 520 can comprise any processing elements discussed below for processor 721 of FIG. 7 or control processor 800 of FIG. 8. Processor 520 can monitor usage statistics, traffic status, or other usage information through link 533. PCIe switch 512 can track this usage information during normal operation and data transfer with storage drives 511, and processor 520 can retrieve this usage information as needed over link 533.

Holdup circuitry 522 is included on storage card 510 to provide power to the storage card when input power has been lost or removed for the storage card. In some examples, the storage card is removed from an associated mating connector and input power is lost due to the removal. In other examples, power is lost to a host system into which storage card 510 is connected, such as during a facility power outage or when an associated power supply fails.

The various holdup circuitry is also accompanied by a power controller circuit 521 to selectively provide power to the elements of storage card 510. The power controller can receive control instructions from a processor of storage card 510 or from other processors or modules, such as over the Inter-Integrated Circuit (I2C), Ethernet, or Universal Serial Bus (USB) sideband interfaces, or over a PCIe interface. Storage card 510 can receive power over one or more power links as a power source for the various elements of storage card 510, and these power links can be included in a PCIe connector of storage card 510. Holdup circuitry 522 includes energy storage devices for storing power received over the power link for use during power interruption events, such as loss of source power. Holdup circuitry 522 can include capacitance storage devices, such as an array of capacitors. Further discussion of examples of power control circuitry is found below.

Although processor 520 and power controller 521 are shown as separate elements in FIGS. 5A and 5B, it should be understood that processor 520 and power controller 521 can be included in the same processing circuitry. In some examples, processor 520 and power controller 521 comprise an ARM-compatible microprocessor or microcontroller, although other circuitry can be employed.

Storage card 510 can provide self-power during power interruption events. Typically, storage card 510 will use any associated holdup power to commit in-flight write data associated with pending write operations before power down of circuitry of storage card 510. The in-flight write data can be committed to associated storage drives 511, or can be committed to other non-volatile memory such as a non-volatile write cache which can hold write data until power is restored. Once any in-flight write data has been committed to non-volatile memory, then excess or remaining holdup power can be held for future use, bled off into dummy loads, or redistributed to other cards over PCIe power links or other power links.

In some examples, no pending write operations are present when input power is lost, and a larger amount of excess power is available on storage card 510. This excess power can be redistributed to a different storage card to aid that storage card in commit processes for associated write operations. Advantageously, excess holdup power of one storage card can be used to power operations of another storage card during power interruptions. This redistributed power can be transferred to other storage cards or other PCIe cards over power links 523 when included in PCIe links 540 or 515.

Power control module 521 includes circuitry to selectively provide power to any of the elements of storage card 510. Power control module 521 can receive control instructions from processor 520 or over link 530. In some examples, power control module 521 comprises processing elements discussed above for processor 520, or is included in the elements of processor 520. Power control module 521 can receive power over power link 523 as a power source for the various elements of storage card 510. Holdup circuit 522 includes energy storage devices for storing power received over power link 523 for use during power interruption events, such as loss of source power. Holdup circuit 522 can include capacitance storage devices, such as an array of capacitors. Further discussion of examples of power control circuitry is found below.

In some examples, bidirectional power flow is possible over link 523. Power can be accepted by storage card 510 when input power is available, such as from a mating connector. Power can be redistributed to other storage cards by module 510 over link 523 when input power is not available, such as during power interruption events. When storage card 510 is removed from a mating connector, then power can be bled off into associated power sink circuitry. Although one power link 523 is shown, it should be understood that more than one link can be included, such as separate input and output links or separate links for different voltage levels.

Figure 7:
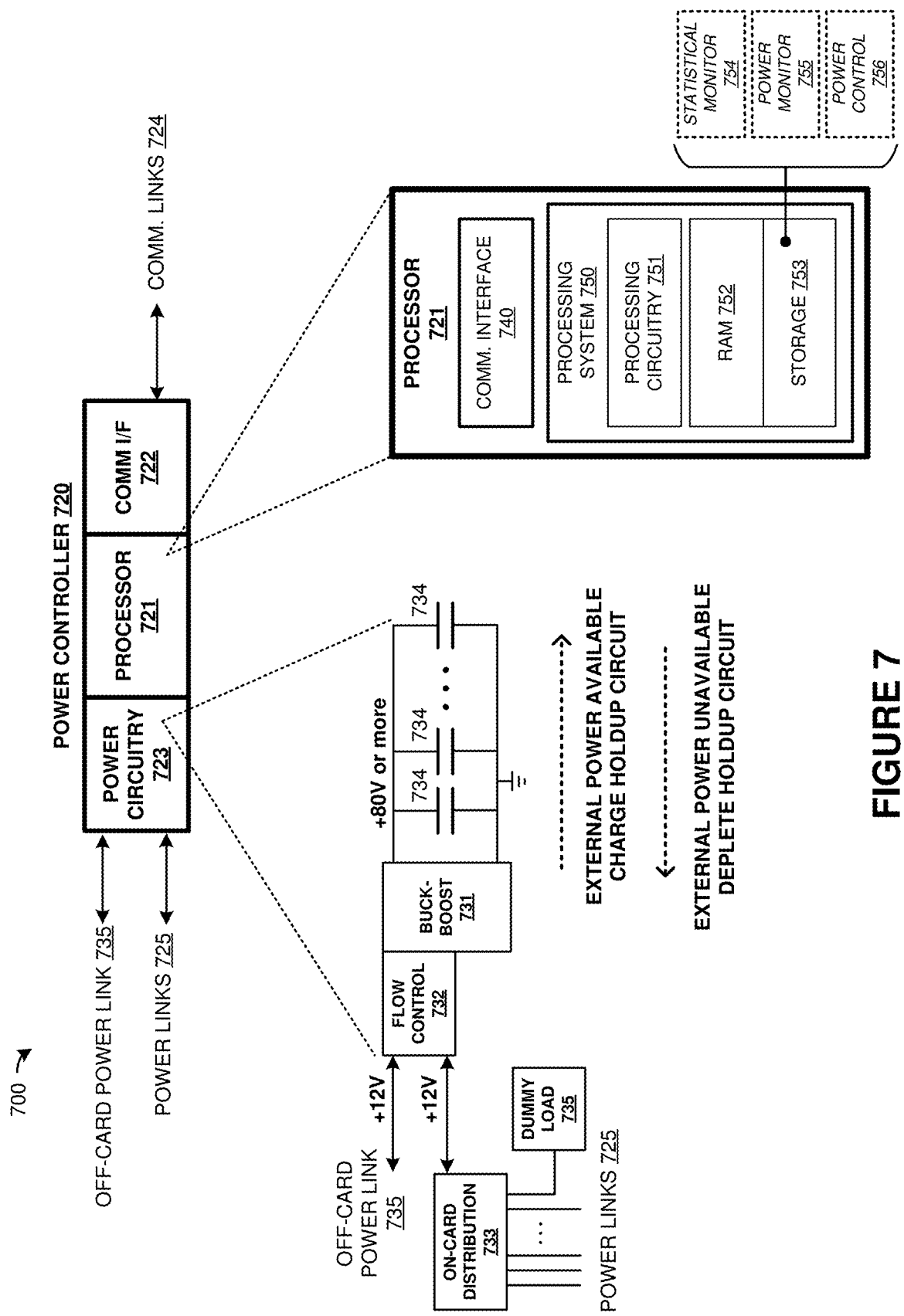
FIG. 7 is a block diagram illustrating a power control system.

FIG. 7 is a block diagram illustrating power control system 700. Power control system 700 can be included on any of the storage cards discussed herein, such as the power controller or holdup circuitry portions of storage card 100 of FIGS. 1A and 1B or storage card 510 of FIGS. 5A, 5B, and 6, among others. Power control system 700 illustrates power controller 720, which can be an example of any of the power control modules or processor discussed herein, such as power control module 521 or processor 520 of FIG. 6. Power controller 720 includes processor 721, communication interface 722, and power circuitry 723. Each of the elements of power controller 720 are communicatively coupled.

Communication interface 722 communicates over communication links 724, which can include any of the communication link protocols and types discussed herein. Communication interface 722 can include transceivers, network interface equipment, bus interface equipment, and the like. In operation, communication interface 722 receives control instructions from another processing unit over communication links 724. Communication links 724 also communicate with elements of the card that power controller 720 is employed on. For example, on a storage card, communication links 724 receive write data commit status of storage drives, power control instructions from other processors or processing systems, and can communicate over a PCIe interface or sideband communications of a PCIe interface.

Processor 721 includes any processor or processing system discussed herein, and controls the operations of power controller 720, such as initiating power up of storage card elements, initiating power down of storage card elements, monitoring usage statistics for a storage card or for other storage cards.

To further describe the circuitry and operation of processor 721, a detailed view is provided, although variations are possible. Processor 721 includes communication interface 740 and processing system 750. Processing system 750 includes processing circuitry 751, random access memory (RAM) 752, and storage 753, although further elements can be included. Example contents of storage 753 are further detailed by software modules 754-756.

Processing circuitry 751 can be implemented within a single processing device but can also be distributed across multiple processing devices or sub-systems that cooperate in executing program instructions. Examples of processing circuitry 751 include general purpose central processing units, microprocessors, application specific processors, and logic devices, as well as any other type of processing device. In some examples, processing circuitry 751 includes physically distributed processing devices, such as cloud computing systems.

Communication interface 740 includes one or more communication and network interfaces for communicating over communication networks or discrete links, such as communication interface 722, or further serial links, packet networks, the Internet, and the like. The communication interfaces can include one or more local or wide area network communication interfaces which can communicate over Ethernet or Internet protocol (IP) links. Communication interface 740 can include network interfaces configured to communicate using one or more network addresses, which can be associated with different network links. Examples of communication interface 740 include network interface card equipment, transceivers, modems, and other communication circuitry. Although communication interface 740 and communication interface 722 are both shown in FIG. 7, it should be understood that these can comprise different interfaces or combined into the same communication interface module, and can communicate over links 724.

RAM 752 and storage 753 together can comprise a non-transitory data storage system, although variations are possible. RAM 752 and storage 753 can each comprise any storage media readable by processing circuitry 751 and capable of storing software. RAM 752 can include volatile and nonvolatile, removable and non-removable media implemented in any method or technology for storage of information, such as computer readable instructions, data structures, program modules, or other data. Storage 753 can include non-volatile storage media, such as solid state storage media, flash memory, phase change memory, or magnetic memory, including combinations thereof. RAM 752 and storage 753 can each be implemented as a single storage device but can also be implemented across multiple storage devices or sub-systems. RAM 752 and storage 753 can each comprise additional elements, such as controllers, capable of communicating with processing circuitry 751.

Software stored on or in RAM 752 or storage 753 can comprise computer program instructions, firmware, or some other form of machine-readable processing instructions having processes that when executed a processing system direct processor 721 to operate as described herein. For example, software drives processor 721 to monitor operating statistics and status for a storage card, monitor power status for the cards and modules, and instruct power circuitry 723 to control flow of holdup power or operational power, among other operations. The software can also include user software applications. The software can be implemented as a single application or as multiple applications. In general, the software can, when loaded into a processing system and executed, transform the processing system from a general-purpose device into a special-purpose device customized as described herein.

Software modules 754-756 each comprise executable instructions which can be executed by processor 721 for operating power controller 720 according to the operations discussed herein. Specifically, statistical monitor 754 monitors usage status or usage statistics for elements of a storage card. The usage statistics include data transfer rates of links, error rates of links, a cumulate number of errors of links, among other statistics. The usage statistics can be collected and stored by processor 721 in a data structure, such as a database or table and stored in storage 753, RAM 752, or other storage elements. Power monitor 755 monitors power inrush statistics during a power-up process, power status statistics, power active status, voltage levels, phase measurements, current draw, holdup circuit status or levels, card/module insertion status, thermal levels, among other statistics. Power control 756 instructs power circuitry to power up or power down an associated storage card or module responsive to statistical monitor 754 or power monitor 755, among other signals such as discrete signals monitored by power circuitry 723. Power control 756 can power up or power down a card or module responsive to data commit status of associated storage drives or other circuitry, responsive to insertion status, or other factors.

Software modules 754-756 can reside in RAM 752 during execution and operation by processor 721, and can reside in storage space 753 during a powered-off state, among other locations and states. Software modules 754-756 can be loaded into RAM 752 during a startup or boot procedure as described for computer operating systems and applications.

Storage 753 can include one or more storage systems comprising flash memory such as NAND flash or NOR flash memory, MRAM, phase change memory, magnetic memory, among other solid state storage technologies. As shown in FIG. 7, storage 753 includes software modules 754-756 stored therein. As described above, storage 753 can store software modules 754-756 in one or more non-volatile storage spaces during a powered-down state of processor 721, among other operating software, such as operating systems.

Processor 721 is generally intended to represent a computing system where at least software modules 754-756 are deployed and executed in order to render or otherwise implement the operations described herein. However, processor 721 can also represent any computing system on which at least software modules 754-756 can be staged and from where software modules 754-756 can be distributed, transported, downloaded, or otherwise provided to yet another computing system for deployment and execution, or yet additional distribution.

Power circuitry 723 includes various power control, voltage regulation, power holdup, and other circuitry. Power circuitry 723 receives power from a power source, such as off-card power link 735, and distributes power to on-card elements over ones of power links 725.

As a specific example of power circuitry 723, various elements are shown in FIG. 7. These elements include buck-boost module 731, flow control module 732, on-card distribution module 733, holdup capacitors 734, and dummy load 735. Buck-boost module 731 comprises one or more switching power regulators that receive power from a power source, such as off-card power link 735, and boosts a voltage associated with the power source to a holdup voltage for holdup capacitors 734. In this example, the power source is provided at +12 VDC and the holdup capacitors 734 are driven at +80 VDC, although different voltages can be employed, such as 125 VDC or higher voltages on holdup capacitors 734. Buck-boost module 731 can also take the energy stored by holdup capacitors 734 and step-down the voltage to a lower voltage, such as 12 VDC for driving on-card or off-card elements using the energy stored in holdup capacitors 734. Processor 721 can communicate with buck-boost 731 to instruct buck-boost 731 to enter a buck mode or a boost mode. Buck-boost 731 can receive control signals or instructions from processor 721, such as over general purpose I/O of processor 721.

To control the flow of energy between on-card power and holdup power, flow control module 732 is employed. Flow control module 732 includes various power switching elements, such as transistor switches, analog switches, solid state switches, diodes, and the like. When external off-card power is available, such as over link 735, then flow control 732 can provide this power to on-card distribution module 733 and to buck-boost module 731 for charging holdup capacitors 734. When external off-card power is not available, then flow control 732 can allow power stored in holdup capacitors 734 and stepped-down by buck-boost module 731 to flow to on-card distribution module 733 instead of off-card power of link 735. Also, as discussed below, when excess energy remains in holdup capacitors 734 after an associated storage card of power controller 720 has had all elements powered down and data committed, then this excess energy can be directed by flow control module 732 to off-card consumers over link 735. In this manner, excess energy stored in holdup devices of power controller 720 can be used to provide power to other cards or devices during a shutdown or commit process. The commit process includes writing any in-flight write data to non-volatile memory. The non-volatile memory can include storage drives of a storage card, or can include separate non-volatile memory dedicated to power-down caching of in-flight data. If the associated storage card of power controller 720 is instead removed from a chassis or connector, then this excess energy of holdup capacitors 734 can be safely bled off using dummy load 735. Flow control module 732 can receive control signals or instructions from processor 721, such as over general purpose I/O of processor 721.

On-card distribution module 733 includes various power flow and switching circuitry to direct electrical power to various elements of a storage card, such as storage drives, PCIe switches, and the like, over links 725. Links 725 can comprise the various power links discussed herein for the various cards. On-card distribution module 733 includes various power switching elements, such as transistor switches, analog switches, solid state switches, diodes, and the like. On-card distribution module 733 can receive control signals or instructions from processor 721, such as over general purpose I/O of processor 721.

Dummy load 735 can include resistive loads, such as heat dissipating electrical elements to bleed off excess energy of a holdup circuit, such as holdup capacitors 734. In some examples, dummy load 735 comprises a high-output light emitting diode (LED) which can efficiently bleed off excess energy using the light output of the LED. This LED can also indicate that energy still remains in the holdup circuit, warning a user of a particular storage card that potentially dangerous or damaging voltages and energies might still exist on a storage card. When a card is inserted into a connector, the LED is normally off. However, when a storage card is removed from a connector, then the LED would be instructed to illuminate and indicate that energy was being bled off of the storage card using the LED. When the LED finally turned off, due to insufficient energy remaining on a card, then the operator can know that dangerous or damaging voltages and energies no longer exist on the storage card. If the LED cannot bleed all of the energy quickly enough, then additional resistive elements can be employed in parallel to assist the LED indicator. Cover plates for the various higher voltage elements, such as capacitors, of system 700 can be employed.

Figure 8:
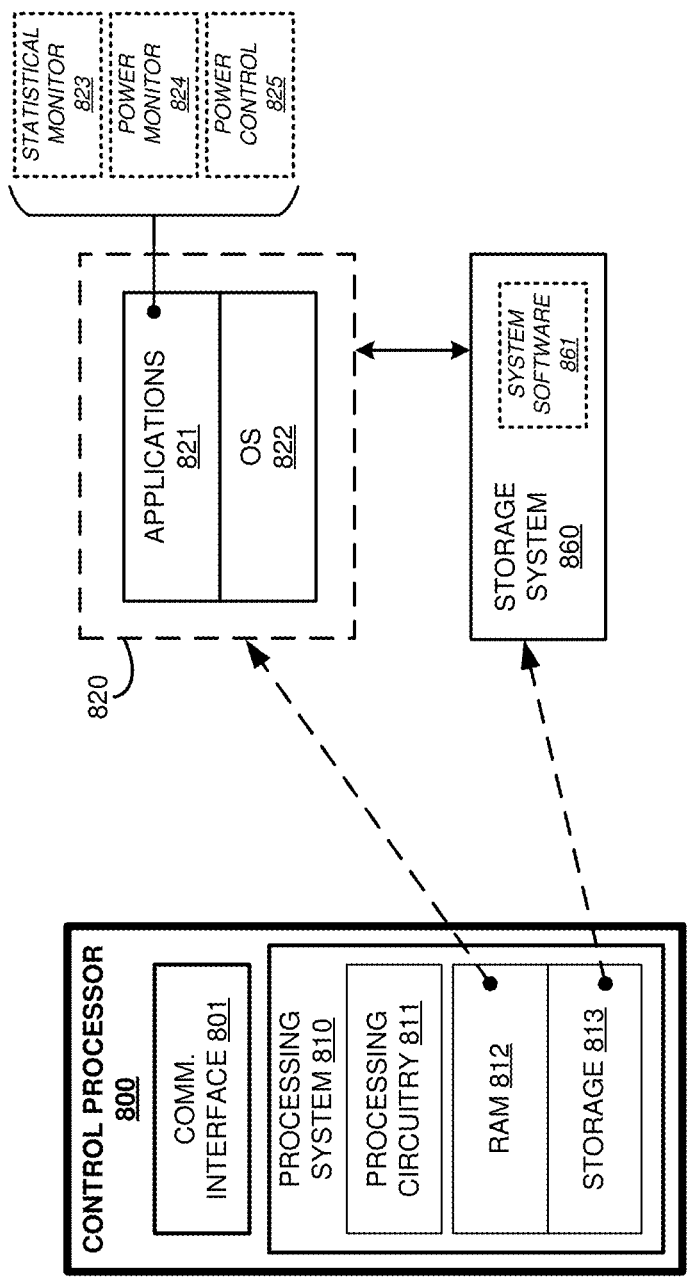
FIG. 8 is s block diagram illustrating a processing system.

FIG. 8 is a block diagram illustrating processing system 800. Processing system 800 illustrates an example of any of the power control modules or card processors discussed herein, such as power control module 521 or processor 520 of FIG. 6, or power controller 720 of FIG. 7. In addition, processing system 800 can be illustrative of any processing system a storage card discussed herein.

Control processor 800 includes communication interface 801 and processing system 810. Processing system 810 includes processing circuitry 811, random access memory (RAM) 812, and storage 813, although further elements can be included. Example contents of RAM 812 are further detailed in RAM space 820, and example contents of storage 813 are further detailed in storage system 860.

Processing circuitry 811 can be implemented within a single processing device but can also be distributed across multiple processing devices or sub-systems that cooperate in executing program instructions. Examples of processing circuitry 811 include general purpose central processing units, microprocessors, application specific processors, and logic devices, as well as any other type of processing device. In some examples, processing circuitry 811 includes physically distributed processing devices, such as cloud computing systems.

Communication interface 801 includes one or more communication and network interfaces for communicating over communication links, networks, such as packet networks, the Internet, and the like. The communication interfaces can include PCIe interfaces, serial links, such as SPI links, I2C links, USB links, UART links, or one or more local or wide area network communication interfaces which can communicate over Ethernet or Internet protocol (IP) links. Communication interface 801 can include network interfaces configured to communicate using one or more network addresses, which can be associated with different network links. Examples of communication interface 801 include network interface card equipment, transceivers, modems, and other communication circuitry.

RAM 812 and storage 813 together can comprise a non-transitory data storage system, although variations are possible. RAM 812 and storage 813 can each comprise any storage media readable by processing circuitry 811 and capable of storing software. RAM 812 can include volatile and nonvolatile, removable and non-removable media implemented in any method or technology for storage of information, such as computer readable instructions, data structures, program modules, or other data. Storage 813 can include non-volatile storage media, such as solid-state storage media, flash memory, phase change memory, or magnetic memory, including combinations thereof. RAM 812 and storage 813 can each be implemented as a single storage device but can also be implemented across multiple storage devices or sub-systems. RAM 812 and storage 813 can each comprise additional elements, such as controllers, capable of communicating with processing circuitry 811.

Software stored on or in RAM 812 or storage 813 can comprise computer program instructions, firmware, or some other form of machine-readable processing instructions having processes that when executed a processing system direct control processor 800 to operate as described herein. For example, software can drive processor 800 to monitor operating statistics and status for various storage cards and other modules, monitor power status for the cards and modules, and instruct power circuitry to control flow of holdup power or operational power, control power down or reset of various on-board storage drives, control performance throttling, among other operations. The software can also include user software applications, application programming interfaces (APIs), or user interfaces. The software can be implemented as a single application or as multiple applications. In general, the software can, when loaded into a processing system and executed, transform the processing system from a general-purpose device into a special-purpose device customized as described herein.

RAM space 820 illustrates a detailed view of an example configuration of RAM 812. It should be understood that different configurations are possible. RAM space 820 includes applications 821 and operating system (OS) 822.

Software applications 823-825 each comprise executable instructions which can be executed by processor 800 for operating a power controller or other circuitry according to the operations discussed herein. Specifically, statistical monitor 823 monitors usage status or usage statistics for elements of cards and modules. The usage statistics include data transfer rates of links, error rates of links, a cumulate number of errors of links, among other statistics. The usage statistics can be collected and stored by processor 800 in a data structure, such as a database or table and stored in storage 813, RAM 812, or other storage elements. Power monitor 824 monitors power statistics during a power up, operational, or power-down processes, power status statistics, power active status, voltage levels, phase measurements, current draw, holdup circuit status or levels, card/module insertion status, thermal levels, among other statistics. Power control 825 instructs power circuitry to power up or power down an associated drive, card, circuitry, or module responsive to statistical monitor 823 or power monitor 824, among other signals such as discrete signals monitored by associated power circuitry. Power control 825 can power up or power down a card or module responsive to data commit status of associated storage drives or other circuitry, responsive to insertion status, or other factors.

Applications 821 and OS 822 can reside in RAM space 820 during execution and operation of control processor 800, and can reside in storage system 860 during a powered-off state, among other locations and states. Applications 821 and OS 822 can be loaded into RAM space 820 during a startup or boot procedure as described for computer operating systems and applications.

Storage system 860 illustrates a detailed view of an example configuration of storage 813. Storage system 860 can comprise flash memory such as NAND flash or NOR flash memory, MRAM, phase change memory, magnetic memory, among other solid state storage technologies. As shown in FIG. 8, storage system 860 includes system software 861. As described above, system software 861 can be in a non-volatile storage space for applications and OS during a powered-down state of control processor 800, among other operating software.

Control processor 800 is generally intended to represent a computing system with which at least software 861 and 821-825 are deployed and executed in order to render or otherwise implement the operations described herein. However, control processor 800 can also represent any computing system on which at least software 861 and 821-825 can be staged and from where software 861 and 821-825 can be distributed, transported, downloaded, or otherwise provided to yet another computing system for deployment and execution, or yet additional distribution.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A computer peripheral device, comprising:
    a slot offset element configured to establish an offset for at least a primary circuit card of the computer peripheral device with respect to a slot connector of a host system to generally align the primary circuit card with a centerline of a slot cover opening of a chassis of the host system when the computer peripheral device is installed into the slot connector;
    the primary circuit card comprising at least a first storage device connector on a first side, and at least a second storage device connector on a second side; and
    a secondary circuit card comprising an edge connector insertable into the slot connector of the host system and configured to carry host signaling for the computer peripheral device;
    wherein the offset established by the slot offset element accommodates within a slot width a stackup comprising storage devices installed into at least the first storage device connector on the first side and the second storage device connector on the second side.

2. The computer peripheral device of claim 1, wherein when the computer peripheral device is inserted into the slot connector, the primary circuit card is not aligned with the slot connector due at least in part to the offset established by the slot offset element, and the secondary circuit card is aligned with the slot connector.

3. The computer peripheral device of claim 1, further comprising:
    a coupling element configured to communicatively couple the host signaling to the primary circuit card from the secondary circuit card, wherein the coupling element comprises at least one of a flexible circuit element and a rigid circuit board element.

4. The computer peripheral device of claim 3, wherein the coupling element comprises a primary connector on the primary circuit card configured to couple to a secondary connector on the secondary circuit card.

5. The computer peripheral device of claim 1, wherein the computer peripheral device comprises a half-height, half-length (HHHL) expansion card, and wherein the host signaling comprises Peripheral Component Interconnect Express (PCIe) signaling.

6. The computer peripheral device of claim 1, further comprising:
    holdup circuitry configured to:
        detect power loss to the computer peripheral device;
        provide power to at least associated storage devices mated with the first storage device connector and the second storage device connector; and
        initiate commits of in-flight data directed to the associated storage devices.

7. The computer peripheral device of claim 1, the first circuit card comprising:
    a connector disposed on the first side for coupling to the second circuit card;
    holdup circuit disposed on the first side configured to provide power to elements of the computer peripheral device; and
    a Peripheral Component Interconnect Express (PCIe) switch circuit disposed on the first side and configured to interwork signaling among the connector and at least the first storage device connector and the second storage device connector.

8. The computer peripheral device of claim 1, wherein the first storage device connector and the second storage device connector each comprise an M.2 device connector or a SFF-TA-1002 device connector.

9. The computer peripheral device of claim 1, the primary circuit card comprising at least a first M.2 storage device connected via the first storage device connector on the first side, and at least a second M.2 storage device connected via the second storage device connector on the second side.

10. A Peripheral Component Interconnect Express (PCIe) data storage card, comprising:
a primary assembly comprising a first circuit board, at least a first storage device connector disposed on a front side of the first circuit board, and at least a second storage device connector disposed on a back side of the first circuit board;
a secondary assembly comprising a second circuit board having an edge connector insertable into a slot connector of a host system; and
wherein the primary assembly is offset from the second assembly by at least an offset distance to generally align the first circuit board of the primary assembly with a centerline of a slot cover opening of a chassis of the host system and is established to accommodate a stackup of at least the primary assembly, the first storage device connector, and the second storage device connector within a peripheral slot width of a host system when the PCIe data storage card is installed into the slot connector of the host system.

11. The PCIe data storage card of claim 10, further comprising:
a PCIe switch circuit configured to receive storage operations over a PCIe host interface corresponding to the slot connector of the host system and transfer the storage operations for delivery over device PCIe interfaces to solid state storage devices mated with the first storage device connector and the second storage device connector.

12. The PCIe data storage card of claim 10, wherein the offset accommodates within the peripheral slot width a stackup of the PCIe data storage card comprising storage devices installed into at least the first storage device connector on the first side and the second storage device connector on the second side.

13. The PCIe data storage card of claim 10, further comprising:
a coupling element configured to communicatively couple host signaling of the slot connector of the host system to the first circuit board from the second circuit board, wherein the coupling element comprises at least one of a flexible circuit element and a rigid circuit board element.

14. The PCIe data storage card of claim 13, wherein the coupling element comprises a first connector on the first circuit board configured to couple to a second connector on the second circuit board.

15. The PCIe data storage card of claim 10, wherein the PCIe data storage card comprises a half-height, half-length (HHHL) expansion card.

16. The PCIe data storage card of claim 10, further comprising:
holdup circuitry configured to:
detect power loss to the PCIe data storage card;
provide power to at least associated storage devices mated with the first storage device connector and the second storage device connector; and
initiate commits of in-flight data directed to the associated storage devices.

17. The PCIe data storage card of claim 10, the primary assembly comprising:
a connector disposed on the front side for coupling to the secondary assembly;
holdup circuit disposed on the front side configured to provide power to elements of the PCIe data storage card; and
a PCIe switch circuit disposed on the front side and configured to interwork signaling among the connector and at least the first storage device connector and the second storage device connector.

18. The PCIe data storage card of claim 10, wherein the first storage device connector and the second storage device connector each comprise an M.2 device connector or a SFF-TA-1002 device connector.

19. A storage apparatus, comprising:
a primary circuit card having a front side and a back side;
at least four M.2 storage devices comprising two M.2 storage devices positioned on the front side of the primary circuit card and two back side M.2 storage devices positioned on the back side of the primary circuit card, each of the at least four M.2 storage devices comprising an associated device Peripheral Component Interconnect Express (PCIe) interface and solid state storage media, and configured to store and retrieve data responsive to storage operations received over the associated device PCIe interface;
a PCIe switch circuit communicatively coupled to the device PCIe interfaces and configured to receive the storage operations issued by a host system over a host PCIe connector of the storage apparatus, and transfer the storage operations for delivery to selected ones of the at least four M.2 storage devices over the associated device PCIe interfaces;
holdup circuitry configured to provide power to the at least four M.2 storage devices after input power is lost to the storage apparatus; and
one or more slot offset elements configured to establish an offset distance between the primary circuit card and a secondary circuit card of the storage apparatus, wherein the secondary circuit card comprises the host PCIe connector and is insertable into a slot connector of a host system;
wherein the offset distance generally aligns the primary circuit card with a centerline of a slot opening of a chassis of the host system, and accommodates a stackup comprising the two M.2 storage devices positioned on the front side of the primary circuit card and two back side M.2 storage devices positioned on the back side of the primary circuit card when the storage apparatus is installed into the slot connector of the host system.

20. The computer peripheral device of claim 1, further comprising:
a slot cover offset element configured to establish a slot cover offset for at least the primary circuit card of the computer peripheral device with respect to the slot cover opening to align a slot cover with the slot cover opening of the host system.

* * * * *